US009147813B2

United States Patent
Ng et al.

(10) Patent No.: US 9,147,813 B2
(45) Date of Patent: Sep. 29, 2015

(54) HIGH THERMAL CONDUCTIVITY AND LOW DEGRADATION DIE ATTACH WITH DUAL ADHESIVE

(75) Inventors: Keat Chuan Ng, Penang (MY); Bit Tie Chan, Pulau Pinang (MY); Kheng Leng Tan, Gelugor (MY)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 485 days.

(21) Appl. No.: 13/228,612

(22) Filed: Sep. 9, 2011

(65) Prior Publication Data
US 2013/0062655 A1 Mar. 14, 2013

(51) Int. Cl.
H01L 33/52 (2010.01)
H01L 33/48 (2010.01)
H01L 23/00 (2006.01)

(52) U.S. Cl.
CPC .............. *H01L 33/486* (2013.01); *H01L 24/29* (2013.01); *H01L 24/32* (2013.01); *H01L 24/83* (2013.01); *H01L 2224/48091* (2013.01); *H01L 2224/48247* (2013.01); *H01L 2224/73265* (2013.01); *H01L 2224/83192* (2013.01); *H01L 2224/83194* (2013.01); *H01L 2224/92247* (2013.01); *H01L 2924/01322* (2013.01); *H01L 2924/07802* (2013.01); *H01L 2924/12041* (2013.01); *H01L 2933/005* (2013.01)

(58) Field of Classification Search
CPC ....... H01L 33/486; H01L 24/29; H01L 24/32; H01L 24/83
USPC .................................................... 257/99, 100
See application file for complete search history.

(56) References Cited

U.S. PATENT DOCUMENTS

| 4,954,197 | A | * | 9/1990 | Jedlicka et al. ............ 156/273.7 |
| 5,117,279 | A | | 5/1992 | Karpman |
| 7,276,739 | B2 | | 10/2007 | Chen et al. |
| 7,381,996 | B2 | | 6/2008 | Hsin Chen |
| 2004/0022499 | A1 | * | 2/2004 | Shimizu et al. ................ 385/52 |
| 2006/0091410 | A1 | * | 5/2006 | Chen .............................. 257/95 |
| 2007/0126097 | A1 | * | 6/2007 | Lin .............................. 257/678 |
| 2011/0042819 | A1 | | 2/2011 | Wen et al. |

* cited by examiner

*Primary Examiner* — Laura Menz
*Assistant Examiner* — Candice Y Chan

(57) ABSTRACT

A package for a light source, a semiconductor device, and methods of manufacturing the same are disclosed. In particular, a Light Emitting Diode (LED) dice is attached to a bonding pad of the light source package by two discrete types of different adhesives. One of the adhesives may be curable under exposure to Ultraviolet (UV) light and the other adhesive may be cured under thermal radiation, but is stable when exposed to UV light.

20 Claims, 8 Drawing Sheets

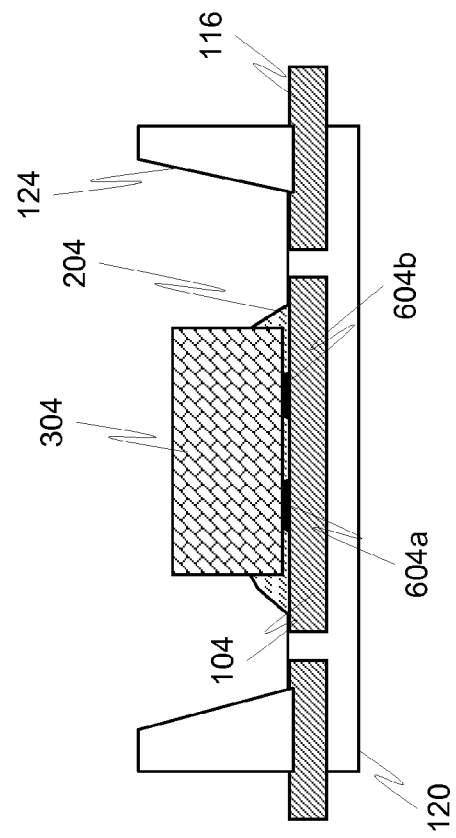
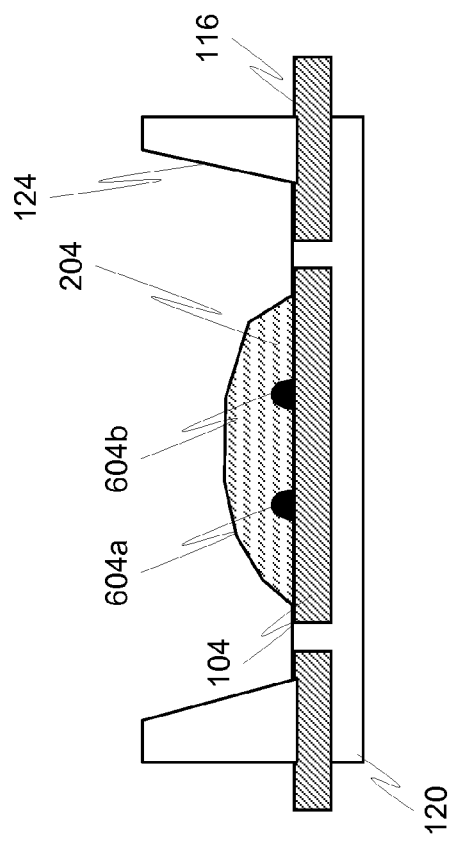

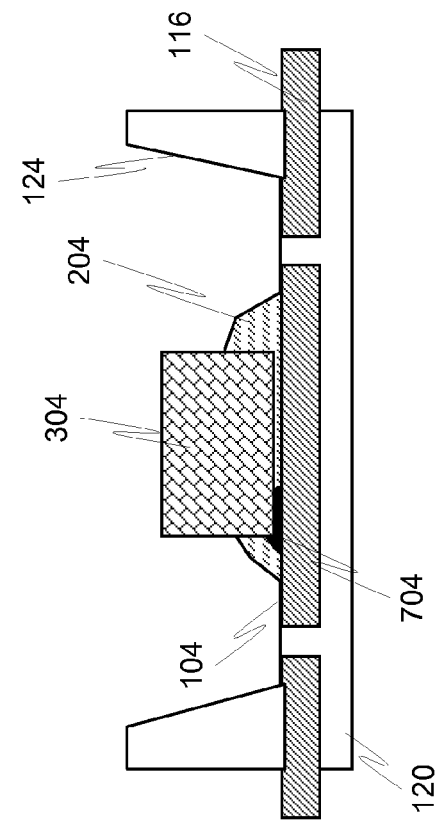
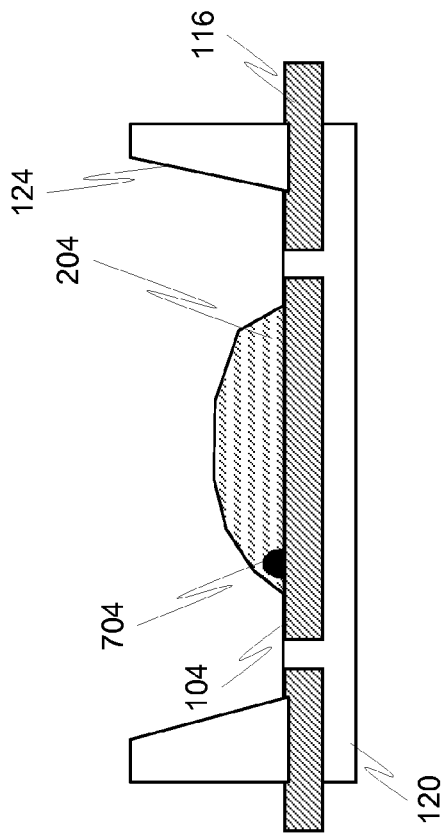

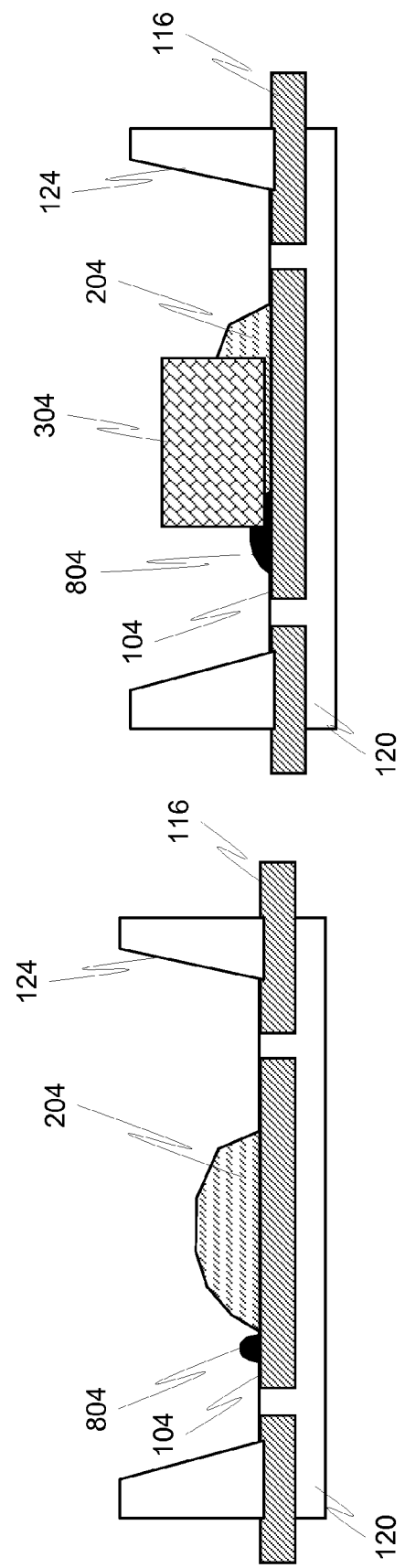

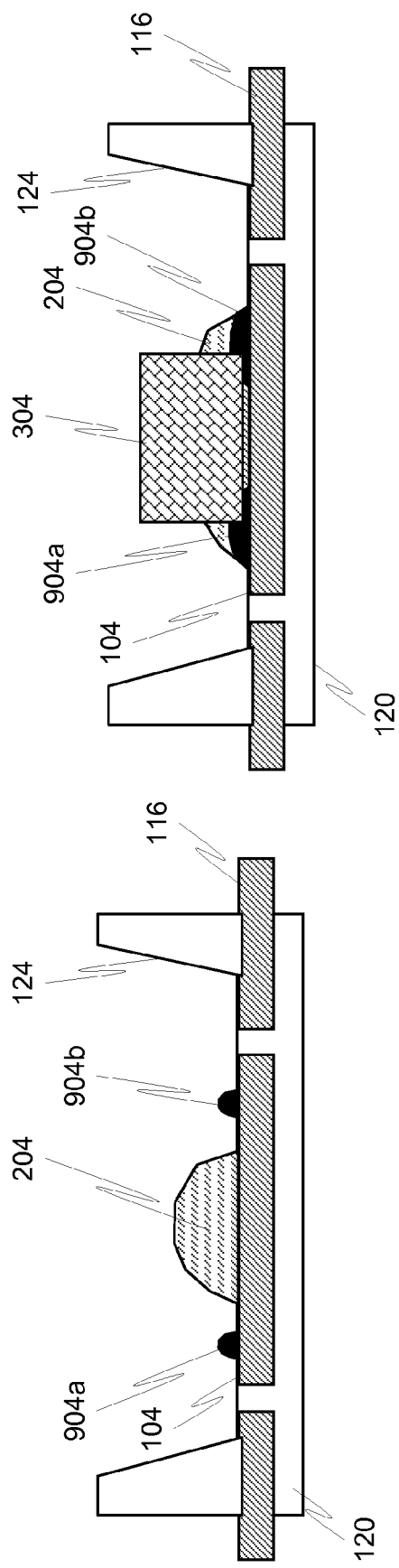

HIGH THERMAL CONDUCTIVITY AND LOW DEGRADATION DIE ATTACH WITH DUAL ADHESIVE

FIELD OF THE DISCLOSURE

The present disclosure is generally directed toward light emitting devices and packages for the same.

BACKGROUND

Light Emitting Diodes (LEDs) have many advantages over conventional light sources, such as incandescent, halogen and fluorescent lamps. These advantages include longer operating life, lower power consumption, and smaller size. Consequently, conventional light sources are increasingly being replaced with LEDs in traditional lighting applications. As an example, LEDs are currently being used in flashlights, camera flashes, traffic signal lights, automotive taillights and display devices.

At present, LED dice can be attached to an LED package using one of two methods. A first method is referred to as eutectic bonding. A second method employs Dice Attach (DA) glue or adhesive. Two different type of DA glues are commonly used: metal-filled glue and transparent/non-conductive glue.

Nowadays, transparent/non-conductive glue is becoming increasingly popular as compared to eutectic bonding due to the low startup costs associated therewith and due to the easy handling. Also, transparent/non-conductive glue provides a better brightness as compared to metal-filled glues, especially when used with transparent LED dice.

With respect to thermal conductivity between dice and package, eutectic bonding provides the best results with the lowest thermal conductivity, followed by metal-filled glue, and finally transparent/non-conductive glue. Therefore, the use of transparent/non-conductive glue is usually not recommended in mid- or high-power products because of the inconsistency of thermal conductivity.

Transparent/non-conductive glue is generally not recommended for mid- or high-power light emitting products because thermal conductivity from the LED dice to the bonding pad is determined by the size of the gap between the LED dice and the bonding pad (a characteristic commonly referred to as Bond Line Thickness (BLT)). The smaller the gap, the better the thermal conductivity.

In industrial standard practices, to obtain optimal thermal conductivity with transparent/non-conductive glue, the gap thickness is desired to be less than 1 um. However, currently available processes for attaching a LED dice to a bonding pad do not reliably control the gap to be less than 1 um. This lack of control over the gap thickness is due to many factors. One factor in particular is that the low viscosity of the transparent/non-conductive glue causes the LED dice to be easily displaced (e.g., moved under application of an outside force, migrated under the LED's own weight, etc.) before the glue is set or cured. Accordingly, it is highly likely that utilization of a transparent/non-conductive glue will result in a gap between the LED dice and bonding pad that is greater than 1 um, which means that the heat generated by the LED dice will not be sufficiently carried away from the LED dice, which means that if the LED dice is operating as a mid- or high-power LED, then the chances of the LED dice failing are greatly increased.

In other words, there are significant challenges with using transparent/non-conductive glue to achieve low thermal conductivity (e.g., uniform gap thickness between the LED dice and bonding pad).

BRIEF DESCRIPTION OF THE DRAWINGS

The present disclosure is described in conjunction with the appended figures:

FIG. 6A is a cross-sectional view of a first alternative intermediate light source package in accordance with embodiments of the present disclosure;

FIG. 6B is a cross-sectional view of a second alternative intermediate light source package in accordance with embodiments of the present disclosure;

FIG. 7A is a cross-sectional view of a third alternative intermediate light source package in accordance with embodiments of the present disclosure;

FIG. 7B is a cross-sectional view of a fourth alternative intermediate light source package in accordance with embodiments of the present disclosure;

FIG. 8A is a cross-sectional view of a fifth alternative intermediate light source package in accordance with embodiments of the present disclosure;

FIG. 8B is a cross-sectional view of a sixth alternative intermediate light source package in accordance with embodiments of the present disclosure;

FIG. 9A is a cross-sectional view of a seventh alternative intermediate light source package in accordance with embodiments of the present disclosure;

FIG. 9B is a cross-sectional view of a eighth alternative intermediate light source package in accordance with embodiments of the present disclosure.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

As can be seen in FIGS. 1-10, a package for a light source and various intermediate products of the same are depicted. As will be described herein, although a particular configuration of package is depicted and described, those of ordinary skill in the art will appreciate that embodiments of the present disclosure are not limited to any particular type of package configuration. In particular, principles discussed herein may be applied to attach one or more light sources of various types to any type of light source package. Accordingly, although a light source package having a particular configuration is described herein, it should be appreciated that embodiments of the present disclosure are not so limited.

For example, although the present disclosure only describes a single light source being attached to a bonding pad, it should be appreciated that embodiments of the present disclosure are not so limited. Specifically, it may be possible to attach a plurality of light sources to a common bonding pad or to different bonding pads without departing from the scope of the present disclosure. It may also be possible to manufacture a plurality of similarly-configured or differently-configured packages simultaneously where two or more light source packages (whether similar or different) are simultaneously manufactured by using two discrete amounts of different adhesives that attach light sources to a bonding pad (whether a common bonding pad or different bonding pads).

Figure 5:
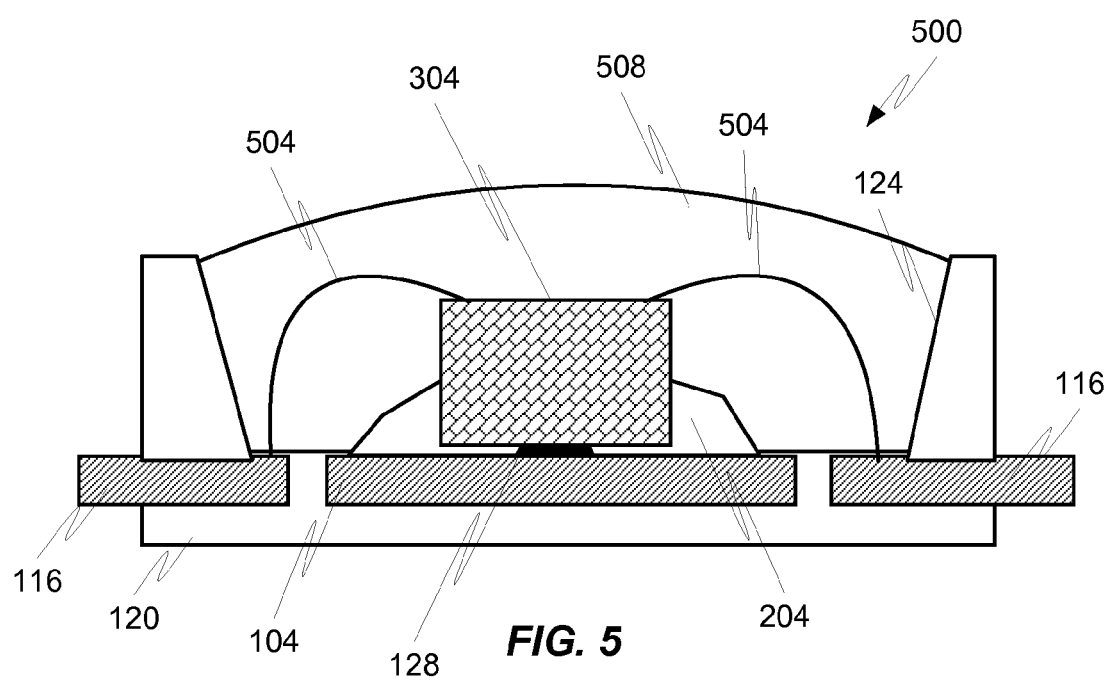
FIG. 5 is a cross-sectional view of a completed light source package in accordance with embodiments of the present disclosure.
Figure 10:
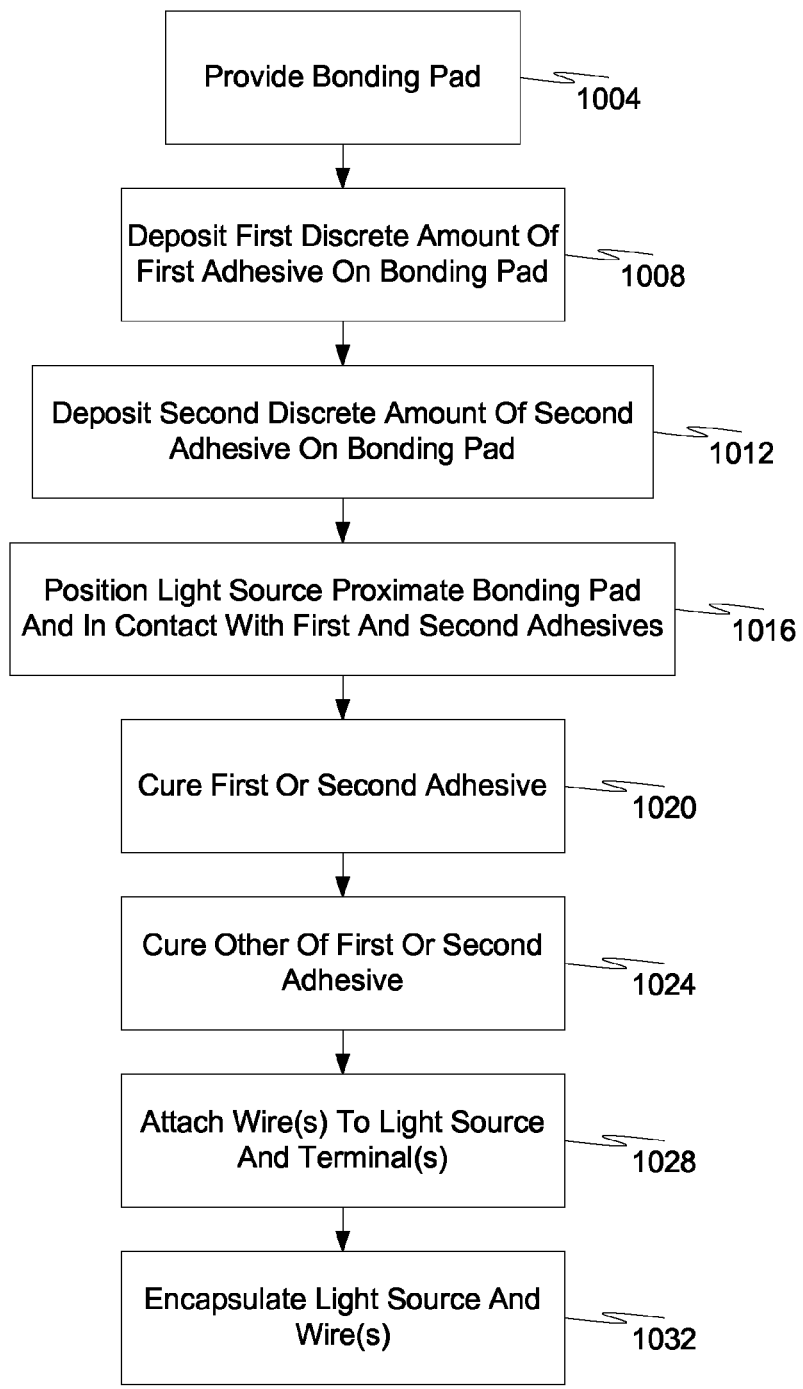
FIG. 10 is a flow diagram depicting a package manufacturing process in accordance with embodiments of the present disclosure.

FIGS. 1-4 depict non-limiting examples of four intermediate package configurations 100, 200, 300, 400, which can be manufactured prior to obtaining a final light source package 500. As can be seen in FIG. 5, the light source package 500 may comprise a number of components in accordance with embodiments of the present disclosure. The package 500 depicted and described herein comprises the advantageous small form-factor available in traditional Plastic Leaded Chip Carrier (PLCC). It may be possible, however, to apply aspects described herein to other types of package form-factors.

In some embodiments, the package 500 comprises a bonding pad 104 and one or more conductive electrodes 116. In some embodiments, the package 500 comprises two conductive electrodes 116 that are electrically separated from one another and the bonding pad 104 by an insulative or non-conductive mold 120. In some embodiments, the bonding pad 104 and the conductive electrodes 116 may be incorporated in a single lead frame that has been molded with the non-conductive mold 120.

In some embodiments, the non-conductive mold 120 may be constructed of any polymer or combination of polymers using extrusion, machining, micro-machining, molding, injection molding, or a combination of such manufacturing techniques. As a non-limiting example, the non-conductive mold 120 may comprise polyphthalamide (PPA). Accordingly, the terms non-conductive mold, PPA, PPA mold, and pre-mold may be used synonymously herein to refer to the element 120 that separates the conductive electrodes 116 and/or bonding pad 104.

The conductive electrodes 116 may be configured to carry electrical current to and from a light source 304 that is attached to a first surface 108 of the bonding pad 104. A second surface 112 of the bonding pad 104 may be positioned opposite the first surface 108 and may not have the light source 304 attached thereto. It should be appreciated that the first surface 108 of the bonding pad 104 may also be referred to herein as a top surface 108 of the bonding pad 104, but such references should not be considered to limit the scope of the present disclosure. Likewise, the second surface 112 of the bonding pad 104 may also be referred to herein as a bottom surface 112 of the bonding pad 104 without limiting the scope of the present disclosure.

In some embodiments, the light source 304 may be configured to emit light from one or more of its surfaces. Specifically, the light source 304 may be configured to emit light from its top surface (e.g., away from the first surface 108), from its bottom surface (e.g., toward the first surface 108), and/or from one or more of its side surfaces (e.g., any surface that connects the top surface of the light source 304 to the bottom surface of the light source 304).

In the depicted embodiments, the light source 304 is only physically connected to the bonding pad 104, but it is not electrically connected to the bonding pad 104. Rather, the light source 304 may be electrically connected to the conductive electrodes 116 that are separate from the bonding pad 104. Stated another way, the light source 304 may not be electrically connected to the surface on which it is mounted. This may be accomplished by using two or more different types of non-conductive adhesives 128, 204. In such embodiments, two or more wires 504 may be connected to the light source 304 and each of the two or more wires 504 may be connected to the conductive electrodes 116. It may also be possible, however, to electrically connect the light source 304 to a lead on which it is mounted via a conductive adhesive or the like in which case only one wire 504 may be required to connect the light source 304 to another one of the conductive electrodes.

In the embodiments depicted herein, the first surface 108 onto which the light source 304 is mounted is not used to carry electrical current to or from the light source 304. Rather, the first surface 108 of the bonding pad 104 only provides a mounting surface for the light source 304. In this particular non-limiting embodiment, a first end of a first wire 504 is attached (e.g., via soldering, welding, gluing, etc.) at a first point on the top surface of the light source 304. A second end of the first wire 504 is then attached to one of the electrodes 116 (e.g., via soldering, welding, gluing, etc.). Continuing the above example, a first end of a second wire 504 is also attached to the top surface of the light source 304, but at a second point (different from the first point) on the top surface of the light source 304. A second end of the second wire 504 is then attached to the other electrode 116. The creation of an electrical potential between the conductive electrodes 116 causes electrical current to flow through the light source 304. Accordingly, an electrical circuit is created between the two conductive electrodes and the light source 304 when an electrical potential is created between the two conductive leads.

The light source 304, in some embodiments, comprises an LED or array of LEDs. Where an LED or similar light source is used, one of the bonding wires 504 is connected to an anode of the light source 304 whereas another of the bonding wires 504 is connected to a cathode of the light source 304. In some embodiments, the anode and cathode are both on the top light-emitting surface of the light source 304. In some embodiments, the anode and cathode are on opposite surfaces of the light source 304. Such a light source 304 may be constructed using known flip-chip manufacturing processes or any other known method for establishing both an anode and cathode on a common side of a light source 304. In either configuration, by connecting the anode and cathode of the light source 304 to two different conductive leads, an electrical potential can be applied to the anode and cathode of the light source 304 thereby energizing the light source 304 and causing it to emit light. Other suitable light sources include, without limitation, a laser diode, an array of laser diodes, an array of LEDs, or a combination of laser diodes and LEDs.

In some embodiments, the non-conductive mold 108, which electrically separates the various components of the lead frame (e.g., bonding pad 104 and conductive electrodes 116), may comprise a reflector cup 124. The reflector cup 124 may be formed in a top portion of the non-conductive mold 108. In some embodiments, the reflector cup 124 encloses the bonding pad 104 onto which the light source 304 is mounted, and partially encloses the conductive electrodes 116. Accordingly, at least some of the electrodes 116 may be made available within the reflector cup 124 such that the wires 504 do not have to extend over the reflector cup 124.

However, while some portions of the electrodes 116 are exposed within the reflector cup 124, other portions of the electrodes 116 may be exposed external to the reflector cup 124. The portions of the electrodes 116 exposed external to the reflector cup 124 may be configured for connection to an external circuit board or the like. Accordingly, the electrodes 116 may be referred to as leads of the package 500 and the portions of the electrodes 116 exposed external to the reflector cup 124 (or an any outer surface of the package 500), may be used for connecting the light source 304 to some other electrical components (e.g., a controller, transistor, resistor, capacitor, etc.) via one or more electrical traces and/or bonding pads. The electrodes 116 or leads exposed on the outer surface of the package 500 may be configured in any type of known lead configuration (e.g., J leads, SOJ leads, gullwing, reverse gullwing, straight-cut leads, etc.).

It should be appreciated that the reflector cup 124 may be formed in any uniform or non-uniform shape (e.g., circular, elliptical, trapezoidal, square, rectangular, triangular, etc.) depending upon the desired light distribution. In some embodiments, the area of the reflector cup 124 is larger its top surface as compared to its bottom surface. This means that the reflector cup 124 gets larger as it extends away from the light source 304. In some embodiments, the top surface of the reflector cup 124 extends above the top surface of the light source 304.

In some embodiments, the inner surface of the reflector cup 124 is coated with a reflective material. Specifically, if the reflector cup 124 is composed of same material as the non-conductive mold 108, it may be necessary to increase the reflectivity of the reflector cup 124 to improve the optical performance of the package 500. In some embodiments, the inner surface of the reflector cup 124 is coated with a reflective material such as tin, aluminum, etc. to increase the reflectivity of the reflector cup 124. The reflective material may be deposited in the reflector cup 124 via any known deposition process such as electroplating, ALD, CVD, magnetron sputtering, and the like.

The package 500 may also comprise an encapsulant 508 that is configured to encapsulate the light source 304 and bonding wires 504 onto the lead frame. Any number of materials may be suitable for use as the encapsulant 508. Examples of such materials include, without limitation, epoxy, silicone, a hybrid of silicone and epoxy, phosphor, a hybrid of phosphor and silicone, an amorphous polyamide resin or fluorocarbon, glass, plastic, or combinations thereof. Furthermore, the encapsulant 508 may be formed to have one or more light-shaping elements (e.g., lens, prism, curved or non-linear feature, etc.) incorporated therein. Specifically, the encapsulant 508 can be formed to have one or more curved surfaces which shape the light emitted by the light source 304 in a desired pattern. As a non-limiting example, the light-shaping element may comprise a dome, a curved surface, a series of curved surfaces, or any other type of surface for directing light in a predetermined pattern. In other embodiments, the encapsulant 508 is filled level within or up to the top of the reflector cup 124 and, therefore, does not have any light-shaping element such as a lens. Accordingly, the encapsulant 508 can serve multiple purposes of (1) protecting the light source 304 and/or bonding wires 504 from physical damage, (2) hermetically sealing the light source 304 and/or bonding wires 504, and/or (3) shaping light emitted by the light source 304.

In some embodiments, the height of the reflector cup 124 may be between about 0.1 mm and 0.3 mm in height and in some embodiments may be about 0.2 mm in height. Depending upon whether the encapsulant 508 has a light-shaping element, the overall height of the package 500 may be between about 0.2 mm and 0.6 mm.

The adhesives 128, 204 used to attach the light source 304 to the bonding pad 104 may be selected to ensure that reliable packages 500 can be manufactured consistently. Specifically, the use of two different adhesives 128, 204 solves many problems with previously-known manufacturing methods. First, the multiple adhesives 128, 204 help to provide a consistent and controllable distance between the bottom surface of the light source 304 and the first surface 108 of the bonding pad 104. Second, the multiple adhesives 128, 204 minimize the amount of adhesive degradation (turning yellow or charring) that is common in Acrylic-based UV-curable adhesives.

In some embodiments, a first discrete amount of a first type of adhesive 128 and a second discrete amount of a second type of adhesive 204 may be used to connect, adhere, attach, or otherwise fix the light source 304 to the first surface 108 of the bonding pad 104. In some embodiments, the ratio of the first discrete amount to the second discrete amount may be between 1:10 and 1:20. In other words, there may be ten to twenty-times as much of the second type of adhesive 204 used as compared to the first type of adhesive 128. Depending upon the type of adhesives 128, 204 used, it may be desirable to minimize the first discrete amount of the first type of adhesive 128 because the first type of adhesive 128 may exhibit a high degradation behavior (e.g., propensity to turn yellow or char) as compared to the second type of adhesive 204. Furthermore, a substantially greater amount of the second type of adhesive 204 may be desirable to ensure the overall brightness of the package 500 is not adversely affected by the degradation of the first type of adhesive 128. However, the first type of adhesive 128 is useful because it can be used to precisely control the distance between the bottom surface of the light source 304 and the first surface 108 of the bonding pad 104.

In accordance with at least some embodiments of the present disclosure, both the first and second types of adhesives 128, 204 are non-conductive DA adhesives. The first type of adhesive 128 may comprise a UV-curable adhesive that quickly cures when exposed to UV radiation (e.g., within one or two seconds of exposure). As a more specific but non-limiting embodiment, the first type of adhesive 128 may comprise an Acrylic-based, transparent, non-conductive, and UV-curable adhesive.

In some embodiments, the second type of adhesive 204 may comprise a transparent and non-conductive adhesive as well. However, the second type of adhesive 204 may differ from the first type of adhesive 128 in that the second type of adhesive 204 may comprise a UV-stable adhesive (e.g., the second type of adhesive 204 may not cure when exposed to the same UV radiation that cures the first type of adhesive 128). The second type of adhesive 204 may, however, be cured under the application of heat or thermal radiation. The second type of adhesive 204 may also comprise thermal conductive properties that are superior to the first type of adhesive 128, which means that the second type of adhesive 204 may be better suited for conducting heat generated by the light source 304 away from the light source 304 and toward the bonding pad 104.

By providing a significant amount of the second type of adhesive 204, it may be possible to achieve a package 500 that solely uses non-conductive and transparent adhesives 128, 204 in mid- or high-power applications (e.g., approximately 10 mA to 100 mA operating current for mid-power applications and approximately 100 mA to 1 A operating current for high-power applications). This is possible because the gap between the power source 304 and bonding pad 104 is precisely controlled with the first type of adhesive 128 and the second type of adhesive 204 provides enhanced thermal-conductive properties.

It should be appreciated that the first and second types of adhesives 128, 204 do not necessarily have to vary based on one being UV-curable and the other being UV-stable. Rather, embodiments of the present disclosure are intended to encompass any configuration of semiconductor device or light source package that employs two discrete amounts of different types of adhesives to connect two different components of the device or package.

In some embodiments, it may be desirable to switch the properties of the adhesives (e.g., a larger amount of UV-curable adhesive may be used as compared to the UV-stable adhesive). In some embodiments, the adhesives may differ in that one adhesive may be transparent and the other may be opaque or semi-transparent. Any two or more different adhesives may be used to compliment one another depending upon the desired properties of the light source package or semiconductor device. Further still, it may be possible to employ three, four, five, or more different types of adhesives without departing from the scope of the present disclosure.

With reference now to FIGS. 1-5 and 10, a method of manufacturing a package 500 and some of the intermediate packages 100, 200, 300, 400 obtained during the manufacture of the package 500 will be described in accordance with embodiments of the present disclosure. The method begins when a bonding pad 120 is received (step 1004). In some embodiments, the bonding pad 120 may be provided as a single bonding pad or it may be provided among a plurality of other bonding pads 120 and electrodes 116 in a lead frame. In some embodiments, the lead frame comprising the bonding pad 120 and electrodes 116 is constructed of a conductive material such as a metal, metal alloy, or composite. In some embodiments, the bonding pad 120 and electrodes 116 may already be provided with the non-conductive mold 120.

Figure 1:
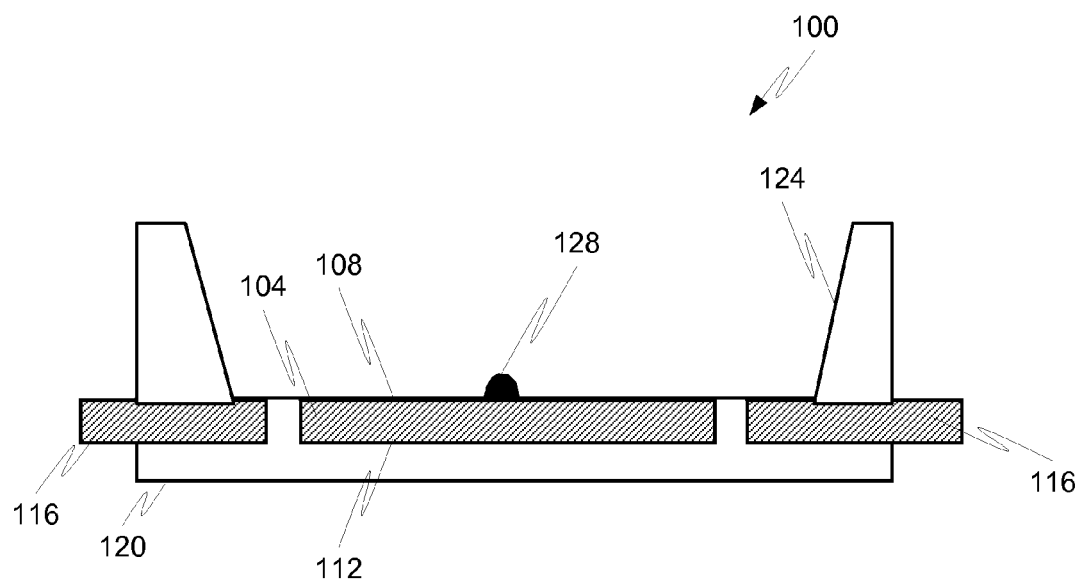
FIG. 1 is a cross-sectional view of a first intermediate light source package in accordance with embodiments of the present disclosure.

The method continues when a first discrete amount of the first type of adhesive 128 is provided on the first surface 108 of the bonding pad 104 (step 1008). As can be seen in FIG. 1, the first type of adhesive 128 may only be provided in a relatively small amount such that it occupies only a small fraction of the first surface 108. In other words, the first intermediate package 100 may comprise the first surface 108 that is mostly exposed except for a small amount of the first type of adhesive 128 that is placed thereon.

Figure 2:
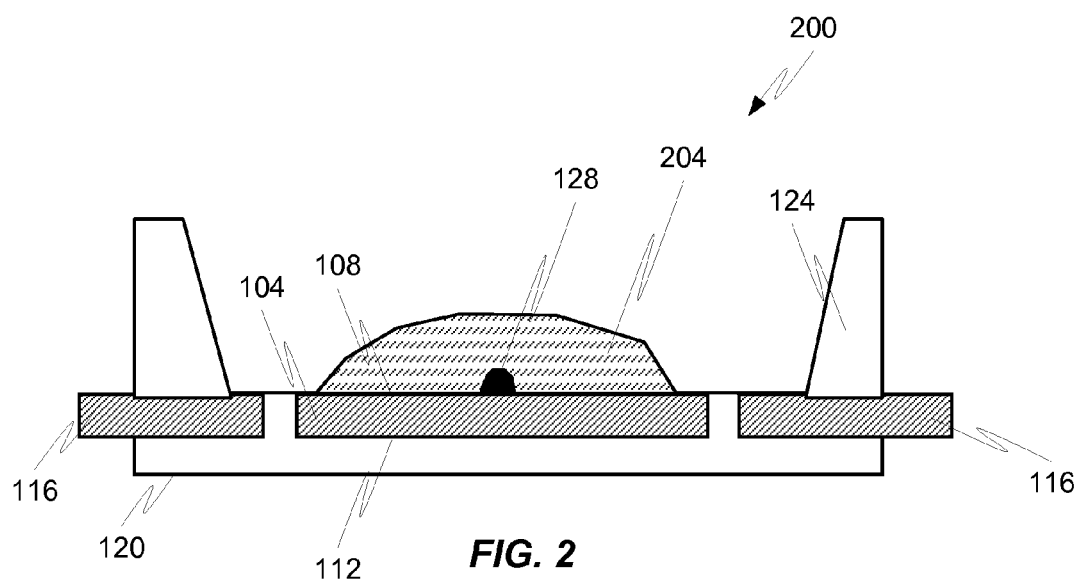
FIG. 2 is a cross-sectional view of a second intermediate light source package in accordance with embodiments of the present disclosure.

A second discrete amount of the second type of adhesive 204 may then be provided on the first surface 108 of the bonding pad 104 to achieve a second intermediate package 200 (step 1012). Although FIG. 2 shows the second intermediate package 200 with the second type of adhesive 204 being provided on top of the first type of adhesive 128, it should be appreciated that embodiments of the present disclosure are not so limited. In particular, as can be seen in FIGS. 6A thru 9B, it may be possible to provide the adhesives 128, 204 next to one another and/or to provide the first type of adhesive 128 on top of the second type of adhesive 204. Accordingly, it is considered to be within the scope of the present disclosure to perform step 1012 prior to and/or simultaneous with step 1008.

Figure 3:
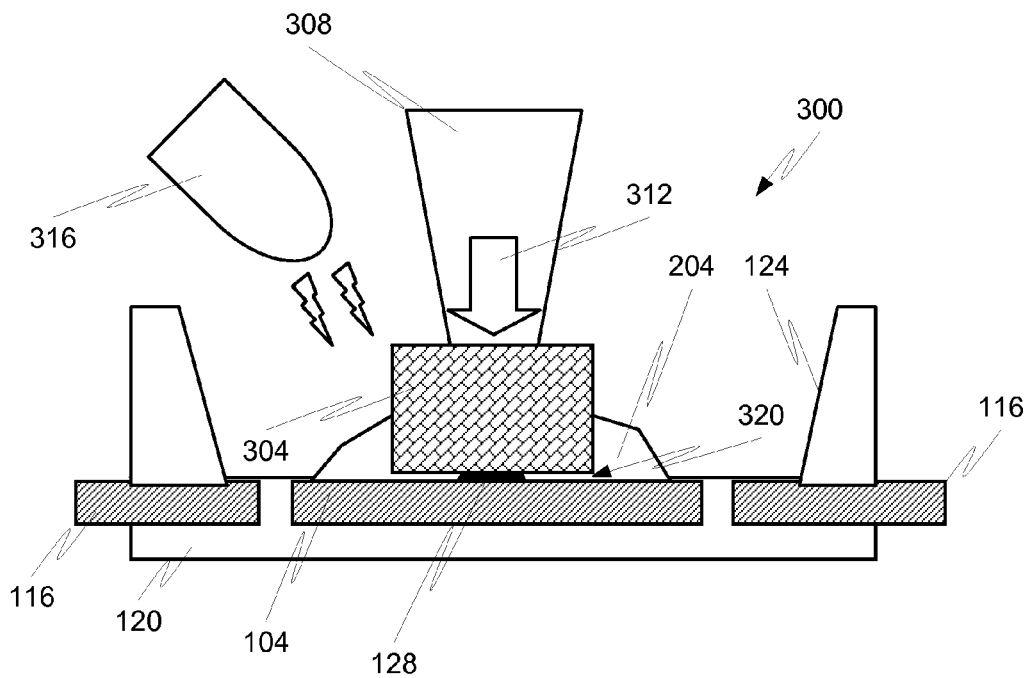
FIG. 3 is a cross-sectional view of a third intermediate light source package in accordance with embodiments of the present disclosure.
Figure 4:
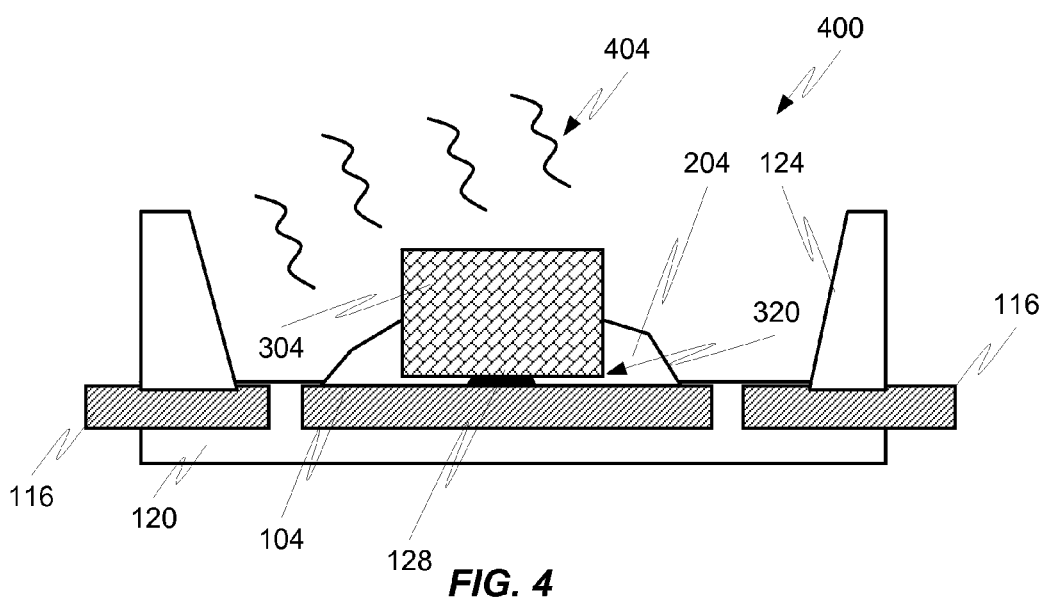
FIG. 4 is a cross-sectional view of a fourth intermediate light source package in accordance with embodiments of the present disclosure.

As can be seen in FIG. 3, once both adhesives 128, 204 are positioned on the first surface 108 of the bonding pad 104, the method continues with the positioning of the light source 304 proximate the bonding pad 104 and in contact with both adhesives 128, 204 (step 1016). In some embodiments, the light source 304 may be positioned automatically with a pick-and-place collat 308. It may, however, be possible to position the light source 304 manually.

In some embodiments, the collat 308 applies a force 312 on the light source 304 so that a gap 320 of a uniform and controlled thickness (e.g., between approximately 0.1 um and 10 um) is left between the light source 304 and bonding pad 104. Specifically, the collat 308 may be configured to hold the light source 304 in a predetermined position for a predetermined amount of time until the third intermediate package 300 is exposed to UV radiation by a UV light source 316 (step 1020). Exposure of the package 300 to the UV radiation may cause the first type of adhesive 128 to cure but not the second type of adhesive 204 to cure. In some embodiments, the first type of adhesive 128 only needs to be exposed to the UV radiation for a second or two; just long enough to cure or partially cure the first type of adhesive 128 and fix or partially fix the height of the gap 320. In some embodiments, the UV radiation reaches the first type of adhesive 128 via the gap 320, which means that only the outer portions of the first type of adhesive 128 may be cured.

After the first type of adhesive 128 has been cured, the method may continue by curing the second type of adhesive 204 (step 1024). In some embodiments, the second type of adhesive 204 may be cured by applying thermal radiation 404 to the package 400. Application of the thermal radiation 404 may cause the second type of adhesive 204 to cure (partially or fully), thereby increasing the strength of the adhesive bond between the light source 304 and the bonding pad 104.

It is somewhat counterintuitive to employ two different types of adhesives 128, 204 and require two different and distinct curing steps to cure the different adhesives 128, 204. However, fixing the first type of adhesive 128 via application of UV radiation only adds a couple of seconds to the manufacturing process. Specifically, most UV-curable adhesives can be sufficiently cured (e.g., enough to ensure that the light source 304 does not "swim" away and change the height of the gap 320) within a second or two, whereas thermal curing usually takes a longer amount of time (e.g., minutes, hours, days). Accordingly, the amount of time added to the manufacturing process by introducing the UV-curing step is an insignificant fraction of the total time that it takes to manufacture the package 500. Furthermore, the advantages achieved by introducing this relatively quick step of curing the first type of adhesive 128 helps to achieve better packages 500 more consistently (thereby increasing overall yields and output efficiencies).

After the adhesives 128, 204 have been cured, the wires 504 are attached to the light source 304 and conductive electrodes 116 (step 1028). Thereafter, the wires 504 and light source 304 may be encapsulated with an encapsulant 508 that protects the light source 304 and wires 504 from the external environment and external forces (step 1032). There are a number of possible ways to encapsulate the intermediate product 400. Specifically, either a casting process or a transfer mold process can be performed to achieve the encapsulation step.

If the package 500 was mass-produced with a plurality of other packages on a single lead frame, then the method may also comprise a singulation step where each package is separated from one another via a saw or similar cutting tool that separates the individual packages 500 from on another.

With reference now to FIGS. 6A thru 9B a number of possible alternative embodiments will be described in further detail. Referring initially to FIGS. 6A and 6B, it may be possible to utilize multiple (e.g., two, three, four, five, or more) discrete amounts of the first type of adhesive 604*a*, 604b. The adhesives 604a, 604b may be similar or identical to the first type of adhesive 128. Specifically, the adhesives 604a, 604b may transparent, non-conductive, and UV-curable. Furthermore, each amount of adhesive 604a, 604b may be positioned under the second type of adhesive 204, but at different discrete locations. Alternatively, or in addition, one or more of the adhesives 604a, 604b may be positioned on top of the second type of adhesive 204. Still further in the alternative, the adhesives 604a, 604b may actually be a single adhesive that is ring-shaped, square-shaped, etc. and, therefore, in cross-section appears to be a plurality of discrete adhesives.

FIGS. 7A and 7B show another embodiment where a first discrete amount of a first type of adhesive 704 is positioned away from the center of the bonding pad 104. The adhesive 704 may be similar or identical to the first type of adhesive 128. By providing the adhesive 704 at a location other than under the eventual center of the light source 304 it may be possible to expose more of the adhesive 704 to the UV radiation during the UV-curing step. This may allow the adhesive 704 to cure faster and/or achieve a stronger bond by virtue of being exposed to a greater amount of UV radiation.

FIGS. 8A and 8B depict yet another embodiment where a first type of adhesive 804 is positioned external to the second type of adhesive 204. The adhesive 804 may be similar or identical to the first type of adhesive 128. In this embodiment, the adhesives 804, 204 may be placed on the first surface 108 in any order or simultaneously. Moreover, the adhesive 804 may be positioned at a location other than under the eventual center of the light source 304, thereby enabling the adhesive 804 to be cured more readily.

FIGS. 9A and 9B depict still another embodiment where multiple (e.g., two, three, four, five, or more) discrete amounts of the first type of adhesive 904a, 904b are positioned external to the second type of adhesive 204. The adhesives 904a, 904b may be similar or identical to the first type of adhesive 128. Furthermore, the adhesives 904a, 904b may actually be a single adhesive that is ring-shaped, square-shaped, etc. and, therefore, in cross-section appears to be a plurality of discrete adhesives. Moreover, the adhesives 904a, 904b may be positioned at a location other than under the eventual center of the light source 304, thereby enabling the adhesives 904a, 904b to be cured more readily. Placement of the light source 304 may, however, cause at least some of the second type of adhesive 204 to flow over the adhesives 904a, 904b.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A light source package, comprising:
a bonding pad;
a first conductive electrode;
a second conductive electrode;
a non-conductive mold that physically separates the bonding pad from both the first conductive electrode and the second conductive electrode;
a light source having a bottom surface that is attached to the bonding pad by a first discrete amount of a first adhesive and by a second discrete amount of a second adhesive, the first adhesive being curable under exposure to electromagnetic radiation and different from the second adhesive, wherein both the first adhesive and the second adhesive directly bond the bottom surface of the light source to the bonding pad, and wherein the first adhesive is completely surrounded by the second adhesive underneath the bottom surface of the light source such that the first adhesive is not exposed beyond the light source;
a first bonding wire connecting the light source to the first conductive electrode; and
a second bonding wire connecting the light source to the second conductive electrode.

2. The package of claim 1, wherein the bonding pad, first conductive electrode, and second conductive electrode are part of a lead frame, the package further comprising an encapsulant that is attached to a top surface of the lead frame and encapsulates the light source, the first bonding wire, and the second bonding wire, wherein the encapsulant is different from the first adhesive and the second adhesive.

3. The package of claim 2, wherein a ratio of the first discrete amount to the second discrete amount is greater than about 1:10.

4. The package of claim 1, wherein the first adhesive is curable under exposure to Ultraviolet radiation and wherein the second adhesive is stable under exposure to Ultraviolet radiation.

5. The package of claim 1, wherein the first discrete amount is less than the second discrete amount, wherein the first and second adhesives are both non-conductive and transparent, wherein the first adhesive cures under exposure to the radiation that travels through the second adhesive and wherein the second adhesive does not cure when the radiation travels therethrough to the first adhesive.

6. The package of claim 5, wherein the second adhesive cures under exposure to thermal radiation.

7. The package of claim 1, wherein the first discrete amount of the first adhesive is positioned underneath the second discrete amount of the second adhesive and wherein both the first and second adhesives are both positioned under the bottom surface of the light source.

8. The package of claim 1, wherein the light source is also attached to the bonding pad by a second discrete amount of the first adhesive.

9. The package of claim 1, wherein the light source comprises at least one Light Emitting Diode.

10. The package of claim 1, wherein the first adhesive is Acrylic-based, UV-curable, non-conductive, and transparent and wherein the second adhesive is UV-stable, non-conductive, and transparent.

11. A semiconductor device, comprising:
a bonding pad having a first surface and an opposing second surface;
a light source having a first surface that faces the first surface of the bonding pad and an opposing second surface, wherein the first surface of the light source is directly connected to the first surface of the bonding pad by a first adhesive and a second adhesive, the first adhesive being curable under exposure to electromagnetic radiation and different from the second adhesive, wherein the first adhesive is positioned between the first surface of the bonding pad and the first surface of the light source and is completely surround by the second adhesive such that the first adhesive is not exposed beyond the light source; and at least one conductive electrode electrically isolated from the bonding pad and electrically connected to the light source.

12. The device of claim 11, wherein the light source is connected to the first surface of the bonding pad by a first discrete amount of the first adhesive and a second discrete amount of the second adhesive, wherein the first discrete amount is less than the second discrete amount.

13. The device of claim 12, wherein the second discrete amount is at least ten times greater than the first discrete amount.

14. The device of claim 12, wherein the second discrete amount is at least twenty times greater than the first discrete amount.

15. The device of claim 12, wherein the first discrete amount of the first adhesive is positioned underneath the second discrete amount of the second adhesive and substantially underneath a center of the light source.

16. The device of claim 11, wherein the bonding pad does not carry current to or from the light source and wherein the bonding pad is connected with a top surface of the light source via a wire.

17. The device of claim 11, wherein the first adhesive and second adhesive are both transparent and non-conductive and wherein the second adhesive does not substantially cure under exposure to the electromagnetic radiation.

18. The device of claim 11, wherein the first adhesive is located adjacent to the second adhesive between the first surface of the bonding pad and the first surface of the light source.

19. The device of claim 11, wherein the first adhesive is Acrylic-based, UV-curable, non-conductive, and transparent and wherein the second adhesive is UV-stable, non-conductive, and transparent.

20. The device of claim 11, wherein the light source comprises at least one Light Emitting Diode.

* * * * *